United States Patent
Kamisawa et al.

(10) Patent No.: US 6,245,451 B1
(45) Date of Patent: *Jun. 12, 2001

(54) FERROELECTRIC MATERIAL, METHOD OF MANUFACTURING THE SAME, SEMICONDUCTOR MEMORY, AND METHOD OF MANUFACTURING THE SAME

(75) Inventors: Akira Kamisawa, Kyoto; Norifumi Fujimura, Izumi, both of (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/068,996

(22) PCT Filed: Sep. 26, 1997

(86) PCT No.: PCT/JP97/03455

§ 371 Date: May 27, 1998

§ 102(e) Date: May 27, 1998

(87) PCT Pub. No.: WO98/13300

PCT Pub. Date: Apr. 2, 1998

(30) Foreign Application Priority Data

| Sep. 27, 1996 | (JP) | 8-256014 |
| Sep. 27, 1996 | (JP) | 8-256015 |
| Sep. 27, 1996 | (JP) | 8-256016 |
| Sep. 27, 1996 | (JP) | 8-256017 |

(51) Int. Cl.[7] ............ B32B 18/00; C01G 45/02
(52) U.S. Cl. ........ 428/697; 428/450; 428/701; 428/702; 427/255.32; 427/585; 427/596; 423/263; 423/275; 423/593; 423/599; 423/605; 365/117; 365/145; 204/192.1

(58) Field of Search ............... 428/450, 469, 428/472, 701, 702, 697; 423/605, 599, 593, 263, 275; 117/947; 427/255.32, 585, 596; 365/117, 145; 204/192.1

(56) References Cited

U.S. PATENT DOCUMENTS

| 3,884,837 | * | 5/1975 | Remika et al. | 252/462 |
| 5,487,356 | * | 1/1996 | Li et al. | 117/99 |
| 5,665,664 | * | 9/1997 | Tomioka et al. | 501/152 |
| 5,684,302 | * | 11/1997 | Wersing et al. | 250/338.3 |
| 5,955,213 | * | 9/1999 | Yano et al. | 428/700 |

FOREIGN PATENT DOCUMENTS

| 403105856A | * | 5/1991 | (JP) . |
| 404002609A | * | 1/1992 | (JP) . |
| 5-255838 | * | 10/1993 | (JP) . |
| 407138082A | * | 5/1995 | (JP) . |
| 8-162614 | * | 6/1996 | (JP) . |
| 9-63991 | * | 3/1997 | (JP) . |
| 9-198729 | * | 7/1997 | (JP) . |

* cited by examiner

Primary Examiner—Deborah Jones
Assistant Examiner—Stephen Stein
(74) Attorney, Agent, or Firm—Arent Fox Kintner Plotkin & Kahn, PLLC

(57) ABSTRACT

A ferroelectric material having a basic structure of $ReMnO_3$, said ferroelectric material comprises Re and Mn one of which is contained in excess of the other to a limit of 20 at. % or the ferroelectric material is further added with a 4-valence element. Also, a method of forming a ferroelectric material, comprises decreasing an oxygen partial pressure within a growth reactor such as a vacuum deposition reactor, and forming a film on a film-forming surface of a substrate (4) while blowing an oxidizing source thereto. This structure provides a ferroelectric material low in leak current and improved in ferroelectric characteristics. Where using the material for a semiconductor memory device, its characteristics can be improved.

13 Claims, 3 Drawing Sheets

FERROELECTRIC MATERIAL, METHOD OF MANUFACTURING THE SAME, SEMICONDUCTOR MEMORY, AND METHOD OF MANUFACTURING THE SAME

TECHNICAL FIELD

This invention relates to a ferroelectric material and method of manufacturing the same, which is possible to constitute a non-volatile memory, a thin-film capacitor, an electrooptic device, and so on, and a semiconductor memory device using the same material. More particularly, the invention relates to a ferroelectric material having a basic structure of $REMNO_3$ (RE refers hereinafter to a lanthanoid group element) and method for forming a thin-film thereof, and to a semiconductor memory device using the thin-film and method of manufacturing the same.

BACKGROUND ART

Conventionally, there has been an FET having a structure formed by a metal film, a ferroelectric film and a semiconductor layer (hereinafter referred to as an MFS structure) as a typical memory (semiconductor memory device) that is adapted to detect a resistance change in the semiconductor layer due to residual polarization in the ferroelectric film. This FET uses a ferroelectric material for a gate dielectric film. As shown in FIGS. 4(a)–(b) with residual polarization, an inversion layer is created in the channel region by ferroelectric residual polarization, enabling write-in. The memory of this type can perform reading out in a non-destructive manner, being advantageous in increasing the rewritable cycle life. In FIGS. 4(a)–(b), 21 is a semiconductor substrate, for example, of a p-type. 22, 23 are respectively source and drain regions formed by introducing an $n^+$ impurity. 26 is a channel region sandwiched between the source region 22 and the drain region 23. The channel region 26 is formed thereon with a ferroelectric film 27 and a gate electrode 28. FIG. 4(a) illustrates an ON state that the gate electrode 28 is applied with a positive potential, while FIG. 4(b) shows an OFF state that the gate electrode 28 is applied with a negative potential. This ferroelectric film 27 conventionally has an oxide perovskite structure such as of $BaTiO_3$, PZT ($Pb(Zr_{1-x}Ti_x)O_3$), PLZT ($Pb_{1-y}La_y(Zr_{1-a}Ti_a)_{1-y/4}O_3$).

In the MFS structure, however, when a ferroelectric film 27 is formed on an Si semiconductor substrate 21, an unwanted film such as of $SiO_2$ is formed at an interface of between them. This causes not only increase in operating voltage but also injection of electric charges by appearance of trap into the ferroelectric film 27. This in turns causes that electric charges are canceled by the residual polarity. In order to avoid this problem, considerations are being given to a MFMIS structure having overlying layers of, from the above, a control electrode, a ferroelectric film, a floating gate, a gate oxide ($SiO_2$), and a Si substrate. This structure enables the ferroelectric material to be film-formed on an electrode metal material so that a ferroelectric film can be formed with proper matching onto the electrode by selecting a metal material.

If an oxide of the oxide-perovskite structure, other than $REMNO_3$, is used as a ferroelectric material as the conventionally done, the Si substrate on which a dielectric film is to be directly formed will have an oxide film on the surface due to oxidation. This oxide film is low in dielectric constant and consumes a voltage much more than the ferroelectric film having a greater dielectric constant, raising a problem of requiring high write-in voltage. Further, there is a possibility that oxygen deficiency occurs in the conventionally-used oxide perovskite structured dielectric, resulting in change of valence number and hence increase of space charges. This raises a problem of lower in ferroelectric characteristics.

Meanwhile, the present inventors has proposed a use of $REMNO_3$ material for nonvolatile memories as disclosed in "Proposal of $REMNO_3$ Thin Film to Nonvolatile Memories" in 56th Applied Physics Academy Study Lecture Preliminary Paper, page 440 (published on Aug. 26, 1995), wherein the same material is an oxide of lanthanoid group elements RE including Y and Mn, and has an advantage of possessing a dielectric characteristic and a small dielectric constant. However, $REMNO_3$ is difficult to determine a film-forming condition for forming a complete crystalline structure. Therefore, it is poor in dielectric characteristic such as of leak current and hence not placed in practical applications.

The present invention has been made in view of such circumstances, and it is an object to provide a ferroelectric material that has a basic $REMNO_3$ structure having improved dielectric characteristics and excellent crystallinity, wherein where used for a semiconductor memory or the like the characteristics thereof can be improved.

It is another object of the present invention to provide a concrete film-forming method using a ferroelectric film by which it is possible to form a ferroelectric film having $REMNO_3$ thus improved in ferroelectric characteristics on a semiconductor substrate or the like.

It is further object of the present invention to provide a semiconductor memory device utilizing the inventive ferroelectric material and a method of manufacturing the same.

DISCLOSURE OF THE INVENTION

The present inventors has eagerly studied in order to obtain a ferroelectric film having a basic structure of $REMNO_3$ excellent in ferroelectric characteristics on an Si substrate or the like. As a result, it was found that if the ferroelectric material comprises RE and Mn one of which is contained in excess of the other to a limit of 20 at. % instead of the ratio thereof 1:1, it is possible to make the composition uniform and reduce leak current thereby improving ferroelectric characteristics.

Here, RE means a lanthanoid group element including Y, Er, Ho, Tm, Yb, Lu, etc. at. % means atomic %. For example, RE being in excess by 20 at. % means that RE and Mn are 1.2:1 in atomic %.

The present inventors has further eagerly studied in order to obtain a ferroelectric film having a basic structure of $REMNO_3$ to improve ferroelectric characteristics. As a result, it was found that $REMNO_3$ is small in bandgap and has a tendency to increase leak current and turn into a p-type due to a presence of somewhat carriers. It was found that the addition of a 4-valence element provides a fine and homogeneous texture and reduce leak current.

Here, the 4-valence element means an element that becomes ions with 4 valences when ionized.

The present inventors has further eagerly studied in order to put a ferroelectric film having a basic structure of $REMNO_3$ into practical application for a semiconductor memory, a thin-film capacitor, etc. on a cause of degradation in crystallinity and increase in leak current if formed on a semiconductor substrate or the like. As a result, found was the followings. Since RE and Mn tend to oxidize, if the oxygen partial pressure is high during vacuum deposition, laser abrasion, sputtering, or the like or if $REMNO_3$ is used as a target, RE and Mn in a material source state oxidize, or their oxides are created during scatter before reaching the surface of the substrate to be film-formed. The formation of RE-rich $RE_2O_3$, Mn-rich $Mn_3O_4$, $REMn_2O_5$, etc. are promoted. The target surface is changed of composition. If a film is formed in a form of these oxides on the substrate surface, the crystallinity deteriorates. If the oxygen partial pressure is lowered than the usual within the film-forming reactor to use a non-oxide target of a RE-Mn alloy and blowing an oxidizing source only to the vicinity of the substrate surface to be formed with a ferroelectric film, a nice crystalline structure of $REMNO_3$ is obtained without creating individual oxides of RE and Mn. Thus a ferroelectric film excellent in ferroelectric characteristics, e.g. reduction in leak current, can be formed. This can also prevent the composition from changing in the evaporation source or during growing a target.

Here, the oxidizing source means a gas or ion, such as oxygen, ozone, $N_2O$, radical ion sources, that can cause an element present therewith to oxidize. Also, the oxygen partial pressure refers to an oxygen pressure in a state that an oxidizing source is blown within a vacuum deposition reactor.

A method of forming a ferroelectric material by vacuum deposition according to the present invention, is characterized by: placing material sources of RE and Mn opposite to a substrate to be formed with a ferroelectric film within a vacuum deposition reactor; controlling an oxygen partial pressure within the vacuum deposition reactor at $10^{-3}$ Torr or lower; evaporating metals of the material sources while blowing an oxidizing source to the film forming surface of the substrate; whereby a ferroelectric material having a basic structure of $REMNO_3$ is film-formed on the surface of the substrate. This vacuum deposition with a low oxygen partial pressure can prevent the material sources from oxidizing and prevent individual oxides of RE and Mn from being created, thereby providing a ferroelectric film good in crystallinity and excellent in dielectric characteristics.

A method of forming a ferroelectric material by laser abrasion according to the present invention, is characterized by placing a target and a substrate oppositely within a reactor; using a non-oxide target formed of an alloy of RE and Mn employed as the target material; controlling an oxygen partial pressure to $10^{-2}$ Torr or lower; irradiating laser to the target while blowing an oxidizing source to a film-forming surface of the substrate; whereby a ferroelectric material having a basic structure of $REMNO_3$ is film-formed on the surface of the substrate.

Also, a method of forming a ferroelectric film by sputtering according to the present invention is characterized by: placing a target and a substrate oppositely within a reactor to form a ferroelectric film on the substrate by sputtering; using a non-oxide target formed of an alloy of RE and Mn as the target; controlling an oxygen partial pressure to $10^{-4}$ Torr or lower; applying a voltage to the target while blowing an oxidizing source to a film-forming surface of the substrate; whereby a ferroelectric material having a basic structure of $REMNO_3$ is film-formed on the surface of the substrate.

In this manner, if a film is formed by using a non-oxide target as a target for laser abrasion or sputtering and reducing the oxygen partial pressure within the reactor, the target is free from change of composition. Further, there is no creation of oxides rich in RE or Mn. Thus, a ferroelectric film is formed with good crystallinity and excellent in dielectric characteristics.

A semiconductor memory device according to the present invention has a ferroelectric film on a semiconductor substrate surface side, wherein the ferroelectric film comprises a ferroelectric material having a basic structure of $REMNO_3$ having Re and Mn one of which is contained in excess of the other to a limit of 20 at. % and/or a ferroelectric material added with a 4-valence element.

A method of manufacturing a semiconductor memory device, according to the present invention, having a ferroelectric film on a semiconductor substrate surface side, is characterized by: placing material sources of RE and Mn opposite to a substrate to be formed with a ferroelectric film within a vacuum deposition reactor; controlling an oxygen partial pressure within the vacuum deposition reactor to $10^{-3}$ Torr or lower; evaporating metals of the material sources while blowing an oxidizing source to the film forming surface of the substrate.

Another method of manufacturing a semiconductor memory device, according to the present invention, having a ferroelectric film on a semiconductor substrate surface side, is characterized by: placing a non-oxide target of an alloy of RE and Mn and a semiconductor substrate oppositely within a reactor; controlling an oxygen partial pressure within the reactor to $10^{-2}$ Torr or lower; irradiating laser to the target while blowing an oxidizing source to the film forming surface of the semiconductor substrate; whereby a ferroelectric material having a basic structure of $REMNO_3$ is film-formed on the surface of the substrate.

A further method of manufacturing a semiconductor memory device, according to the present invention, having a ferroelectric film on a semiconductor substrate surface side, is characterized by: placing a non-oxide target of an alloy of RE and Mn and a semiconductor substrate oppositely within a reactor; controlling an oxygen partial pressure within the vacuum deposition reactor to $10^{-4}$ Torr or lower; applying a voltage to the target to cause sputtering while blowing an oxidizing source to a film forming surface of the semiconductor substrate;

whereby a ferroelectric material having a basic structure of $REMNO_3$ is film-formed on the surface of the semiconductor substrate.

PREFERRED EMBODIMENT OF THE INVENTION

Figure 1:
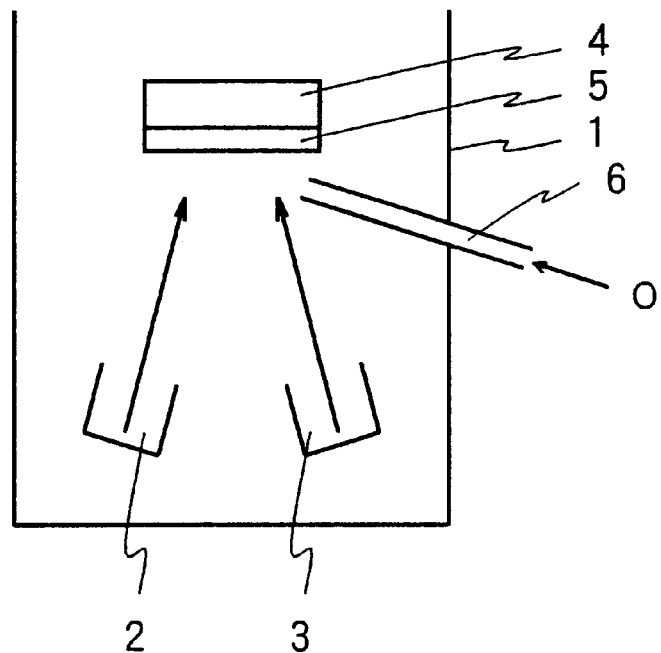
FIG. 1 is a typical explanatory view of a vacuum depositing reactor used for forming a ferroelectric film according to the present invention.

Now, explanations will be made on a ferroelectric material and method to prepare the same, and a semiconductor memory device utilizing the ferroelectric material and method to manufacture the same, with reference to the drawings.

As stated hereinbefore, $REMNO_3$ is characterized by the followings:

(1) less space charge due to oxygen deficiency because both RE and Mn are a metal ready to oxidize.

(2) less space charge because a volatile element, such as Pb and Bi, is not contained.

(3) less fatigue caused by domain inversion because of a ferroelectric with a uniaxial (hexagonal crystal) structure.

(4) having a nature to reduce the native oxide film on a Si substrate bordering on the ferroelectric film to allow voltages to effectively apply to a ferroelectric film, where it is utilized for an MFS device.

(5) having a specific dielectric constant of as low as 20, and accordingly it is possible to effectively apply voltages to a ferroelectric film where it is utilized for a device of an MFS structure (a structure having an dielectric film between a ferroelectric film and a semiconductor substrate).

(6) possible to use a ZnO electrode with reduced electric resistance by adding a 3-valence element, where used in a floating gate type (MFMIS structure, mentioned before). This ZnO has an advantage that is easy to c-axis align on any substrate and to etch.

However, where an $REMNO_3$ thin film is to be formed on a semiconductor substrate in order to manufacture, for example, a semiconductor memory device, the resulting dielectric film is rich in RE or Mn due to composition change on a target surface or individual oxidation of material sources RE and Mn during vacuum deposition. As a result, the film surface is in an amorphous form, and a complete crystalline thin film is difficult to form with stability. Consequently, there has not been in practical application for semiconductor devices, thin film capacitors, etc.

The present inventors have eagerly studied in order to stably form an $REMNO_3$ thin film excellent in crystallinity on a semiconductor substrate or the like, and found the following fact. That is, RE and Mn tend to easily oxide as stated before. With a film forming method, such as a film forming method using an $REMNO_3$ target, of evaporating oxygen from a raw material, the target surface is varied in composition by the influence of evaporated oxygen even if the partial pressure of oxygen is reduced in the film forming reactor. As a result, the growth of an $REMNO_3$ is hindered by a film formed in a oxide containing RE-rich $RE_2O_3$, Mn-rich $Mn_3O_4$ or $Mn_2O_5$ on the substrate. This is similarly encountered when an oxygen partial pressure is high in a vacuum vapor deposition method. The inventors have further eagerly studied, and found that an $REMNO_3$ ferroelectric thin film with excellent crystallinity can be formed on a substrate. That is, the partial pressure is considerably reduced than the usual case within a vacuum deposition reactor or a sputtering apparatus (an oxygen partial pressure of $10^{-3}$ Torr or lower in vacuum deposition, $10^{-2}$ Torr or lower in laser abrasion, and $10^{-4}$ Torr in sputtering). The ferroelectric film is formed while locally blowing an oxidation source such as oxygen, ozone, $N_2O$, or radical ions to the vicinity of substrate surface. A non-oxide having no oxygen content is used as a target. With this method, it is possible to prevent against oxidation in an evaporation source or variation in target composition. Further, individual elements are avoided from oxidizing in the evaporation source in vacuum deposition, or during sputtering from the target reaching to the substrate.

That is, where forming a usual $PbTiO_3$ oxide film in a vacuum deposition reactor, an oxide film excellent in crystallinity is not obtained unless the oxygen partial pressure is raised higher than $10^{-2}$ Torr. When forming the oxide film in a vacuum deposition reactor, it is common practice to form at an oxygen partial pressure of $10^{-2}$ Torr or higher. However, where forming an $REMNO_3$ film, there is no tendency of forming an individual oxide film of RE or Mn at $10^{-3}$ Torr within a vacuum deposition reactor despite RE and Mn are ready to oxide. The blowing of an oxygen source over the film-forming surface of the substrate enables formation of an excellent crystallinity of an $REMNO_3$ ferroelectric film. The above-stated oxide partial pressure is preferably at $10^{-6}$ Torr or lower, because a ferroelectric film basically structured by $REMNO_3$ can be formed without occurring an Re-rich or Mn-rich oxidation.

Also, where using $REMNO_3$ as a target, even if the oxide partial pressure is reduced within the film-forming apparatus, the oxygen contained in the target varies the composition of the target or RE and Mn is oxidized before reaching the substrate surface from the target, resulting in RE-rich or Mn-rich oxide formation. This problem, however, is prevented by employing a non-oxide as a target with the oxide partial pressure reduced within the film-forming reactor. Thus, an $REMNO_3$ with good crystallinity is film-formed. Incidentally, in laser abrasion it is preferred use an oxygen partial pressure of $10^{-4}$ Torr or lower within a film-forming reactor, in order to prevent an individual oxide of RE or Mn during forming a film and form a ferroelectric film excellent in crystallinity and ferroelectric characteristics.

Now, explanations will be made on a method of forming a $YMnO_3$ film using Y as an RE element by various film-forming reactor.

FIG. 1 is a typical explanatory view forming a $YMnO_3$ by using a vacuum depositing reactor, for example, called an MBE (Molecular Beam Epitaxy) method. In FIG. 1, 1 is a vacuum chamber. 2, 3 are respective material sources filled with Y and Mn, having a heater, a shutter, and the like, not shown. 4 is a substrate formed, for example, of silicon on which a ferroelectric film is to be formed. 5 is a $YMnO_3$ film-formed on a surface of the substrate 4. 6 is an oxidizing source supply passage for supplying an oxygen source such as oxygen, ozone, or the like.

In this structure, a substrate 4 on which a ferroelectric film is formed is set within the vacuum chamber 1, and Y and Mn are respectively filled in crucibles of the material sources 2, 3. The vacuum chamber 1 is evacuated down to an oxygen partial pressure of $10^{-9}$ Torr or lower. The substrate 4 is heated up to approximately 700° C. and Y and Mn are brought into a molten state. Thereafter, an oxygen source is blown to over the surface of the substrate. Y and Mn are scattered toward the substrate 4 by opening the shutters in the material sources 2, 3. The oxygen partial pressure is held at approximately $10^{-4}$ to $10^{-6}$ Torr. The present invention is characterized by blowing an oxidizing source directly over the surface of the substrate 4 and reducing an oxide partial pressure to approximately $10^{-3}$ Torr or lower, preferably $10^6$ Torr or lower, within the vacuum chamber 1. Incidentally, in this case the blowing of an oxygen source increases the oxygen partial pressure to approximately $10^{-8}$ Torr or higher. That is, it is usual practice for vacuum deposition to carry out in a state of an oxygen partial pressure of higher than approximately $10^{-2}$ Torr. In a state of a high oxygen partial pressure, however, Y and Mn oxidize in a state of the material source 2, 3 or during travel from the material source 2, 3 to the surface of the substrate 4, as stated before. As a result, no complete $YMnO_3$ crystal is formed due to creating $Y_2O_3$ or $Mn_3O_4$. In the method of the invention, however, the elements, such as Y and Mn, ready to oxidize will not turn into an oxide before reaching the substrate 4. Y and Mn are oxidized by the oxygen supplied over the substrate 4 while depositing thereon, and accordingly a $YMnO_3$ crystalline structure is created and film-formed on the substrate 4. It is particularly preferred that the oxygen partial pressure is $10^{-6}$ Torr or lower as stated before. However, with a partial pressure of as low as $10^{-3}$ Torr or below, Y and Mn can respectively prevented from oxidizing, and a $YMnO_3$ oxide is created due to supply of oxygen to the surface of the substrate 4.

Figure 2:
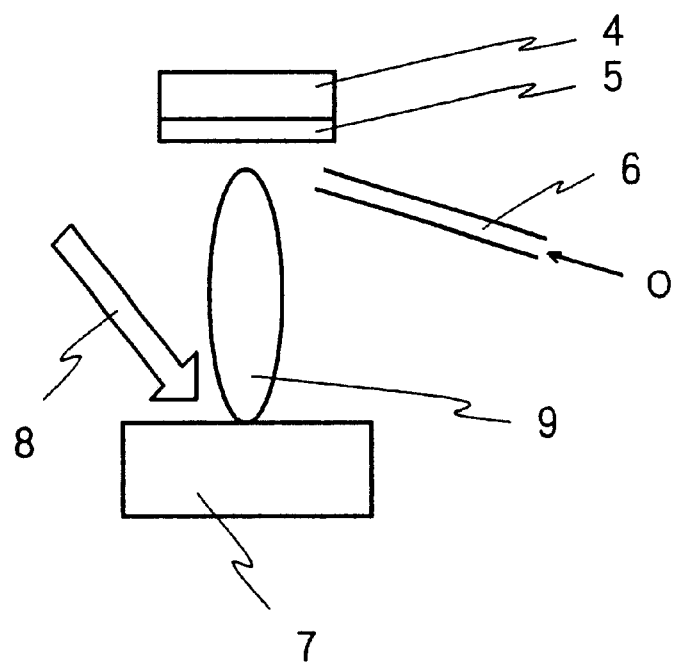
FIG. 2 is a typical explanatory view in forming a ferroelectric film of the present invention by laser abrasion.

FIG. 2 is a typical explanatory view of forming a $YMnO_3$ film by a laser abrasion method. In FIGS. 2, 4 to 6 refer to a same part of FIG. 1. 7 is a non-oxide target such as of a Y-Mn alloy, for example. 8 is a laser light source which may use a excimer laser having a laser beam, for example, of an energy density of 0.5–2 $J/cm^2$ with a pulse of 5–20 Hz. 9 represents a bloom occurring upon irradiating a laser pulse to the target 7. This laser abrasion method is characterized by using a Y-Mn alloy as a non-oxide target and an oxygen source is blown to over a film forming surface of the substrate 4 so as to form an oxide thin film. That is, the use of an oxide target causes the target to vary in composition, whereas the use of the non-oxide target of the present invention will not change the composition of the target thereby forming a ferroelectric film excellent in crystallinity.

With this structure, the oxygen partial pressure was reduced to approximately $10^{-4}$–$10^{-5}$ Torr within the growth chamber, and the substrate 4 was raised to a temperature of approximately 700° C. to grow the laser beam to 24000 pulses. As a result, a ferroelectric thin-film of a $YMnO_3$ crystal was formed in a thickness of approximately 0.3–1 $\mu$m. In this laser-abrasion film forming, prevention has to be given against the target oxidation and the accompanying composition change, similarly to the above-described vacuum deposition. Further, Y and Mn must not be individually oxidized during sputtering from the target to the substrate surface. In order to meet with this, it is preferred that the inside of the film-forming reactor is reduced in pressure to $10^{-2}$ Torr or lower, more preferably $10^{-4}$ Torr or lower and the oxygen partial pressure is given at $10^{-8}$ Torr and higher. With this condition, a ferroelectric film can be grown on the surface of the substrate 4 while blowing an oxygen source to the surface of the substrate 4.

Meanwhile, the film-forming method by sputter uses a reactor similar, in a typical view, to the reactor of FIG. 2. However, this method is different in that an inert gas atmosphere such as of Ar is used in place of irradiating a laser beam so that the inert gas is ionized by applying a high voltage between the substrate to thereby cause the element of the target sputtering. This method is also characterized by using a non-oxide for the target 7 and the oxygen partial pressure is reduced to $10^{-4}$ Torr within the film-forming reactor so that the film-forming surface is blown with an oxidation source to form a film thereon.

Specifically, the film was formed by raising the substrate temperature to approximately 700° C. due to a magnetron sputter method, for example, with an RF output of 75W with the oxygen partial pressure given at $10^{-3}$–$10^{-4}$. As a result, the use of the non-oxide target of the present invention did not cause change of composition in the target, similarly to the laser abrasion case. Thus, a dielectric film could be formed with high crystallinity. Incidentally, the lower limit of the oxygen partial pressure is preferably $10^{-8}$ Torr or higher.

The present inventors has further eagerly studied to improve such characteristics as leak current reduction for applications in memories and thin-film capacitors. As a result, it was found that, by taking a Y/Mn atomic ratio of greater than 1 and smaller than 1.2 or smaller than 1 and greater than 0.8, the surface is suppressed from being formed with an amorphous layer to provide grains with fineness and homogeneity, lessening frequency dispersions in dielectric constant as well as reducing current leaks. This is attributable to the fact that the $ReMnO_3$ is low in bandgap and the existence of somewhat carriers increases current leakage.

To form a $YMnO_3$ ferroelectric film having a composition like this, Y and Mn in the material sources may be controlled in evaporating amount for the vacuum deposition method while the ratio of the both may be controlled during making a target for the laser abrasion method or the sputter method. This provides a ferroelectric film having a basic $YMnO_3$ structure having a same composition as the target but deviated in a Y-Mn ratio.

Further, the inventors has further studied with this material in order to improve such characteristics as leak current reduction. As a result, it was found that an $REMNO_3$ thin film of a ferroelecric film is in a p-type and current leakage can be reduced by adding a 4-valence element or substituting part of RE with a 4-valence element. That is, the ferroelectric films formed in the above-stated methods were measured of electromotive force by both a thermal probe method and a method utilizing a Hall effect. As a result, it was revealed that $REMNO_3$ in the conventional form is in a p-type but the p-type disappeared from the observation when a 4-valence element was added. If a 4-valence element is added or part of Y is substituted by a 4-valence element, the resulting $REMNO_3$ has a fine and homogeneous texture to thereby reduce current leak despite it is low in bandgap to readily increase current leak.

To film-form a ferroelectric film having a basic $YMnO_3$ structure added with a 4-valence element, the vacuum deposition method may be further prepared with a material source for a 4-valence element or La so that the element is evaporated, together with Y and Mn, under control of evaporation amount. In the laser abrasion method or the sputter method, on the other hand, a 4-valence element or La may be further added to Y and Mn when preparing a Y—Mn alloy target. Otherwise, the method is similarly carried out by using a target formed of a Y—Mn—La alloy having a content reduced of a 4-valence element or La. Thus, it is possible to obtain a ferroelectric film having a basic $YMnO_3$ structure wherein a 4-valence element added thereto or part of Y is substituted by a 4-valence element. That is, in also this case, if an oxide target is employed, the presence of oxygen on the target surface causes Y precipitate on the surface of target so that the film composition becomes considerably excessive in Y, worsening the reproducibility of growth conditions. However, the use of a non-oxide target is free from phenomenon such as composition change, making it possible to stably forming a well-crystallinity ferroelectric film.

Incidentally, although the above-described methods provide a well-crystallinity ferroelectric film having a basic $YMnO_3$ structure wherein the ratio of Re and Mn is varied or a 4-valence element is added, if the ratio of Re and Mn is varied or a 4-valence element is added in the conventional vacuum deposition method, laser abrasion method or sputtering method (includes a method using an oxide as a target), the effects thereof will be higher than the conventional as per se. That is, Re and Mn material sources are provided opposite to a substrate to be formed with a ferroelectric film. The material source metals are evaporated by differing the evaporation amount between RE and Mn, and/or by increasing the content of one of RE and Mn in excess of that of the other to a limit of 20 at. % and adding a 4-valence element as a part of RE and Mn. This enables formation, on the substrate surface, of a ferroelectric material having a basic REMNO₃ structure wherein a 4-valence element is further added or part of RE is replaced by the 4-valence element.

Further, a ferroelectric material having a basic structure of REMNO₃ can be film-formed on the surface of the substrate by a laser abrasion, wherein the material contains RE and Mn one of which is in excess than the other to a limit of 20 at. % and/or has a composition further added with a 4-valence element or part of RE is substituted by the 4-valence element. This uses a method of forming a ferroelectric material by laser abrasion, comprising placing a target and a film-forming substrate to oppositely within a reactor, wherein the target is formed different in content ratio between RE and Mn, or added with a 4-valence element.

Further, a ferroelectric material having a basic structure of REMNO₃ can be film-formed on the surface of the substrate by sputtering, wherein the material contains RE and Mn one of which is in excess than the other to a limit of 20 at. % and/or has a composition further added with a 4-valence element or part of RE is substituted by the 4-valence element. This uses a method of forming a ferroelectric material by placing a target and a film-forming substrate oppositely, wherein the target is formed different in content ratio between RE and Mn, and/or further added with a 4-valence element.

Although the above examples used Y as a lanthanoid group element RE, the similar effect is available by using an other lanthanoid group element Yb, Er, Ho, etc. than Y.

Figure 3:
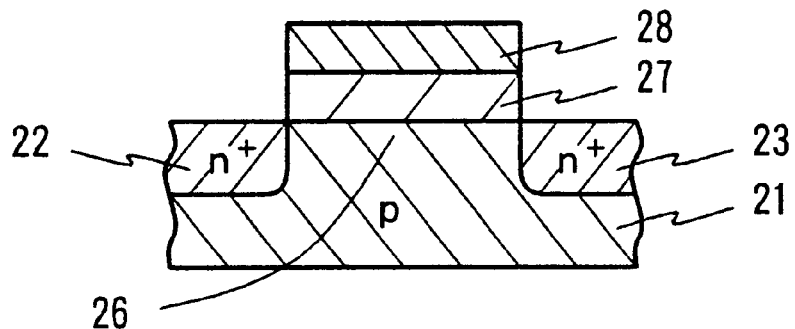
FIGS. 3(a), 3(b) and 3(c) are views illustrating a structural example of a semiconductor device to which a ferroelectric material of the present invention is applied.
Figure 3:
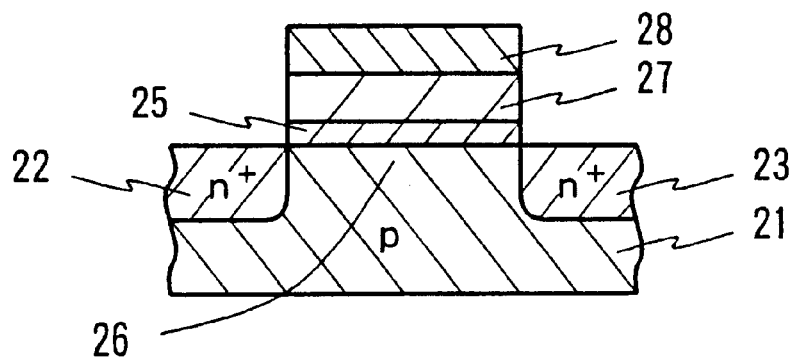
Figure 3:
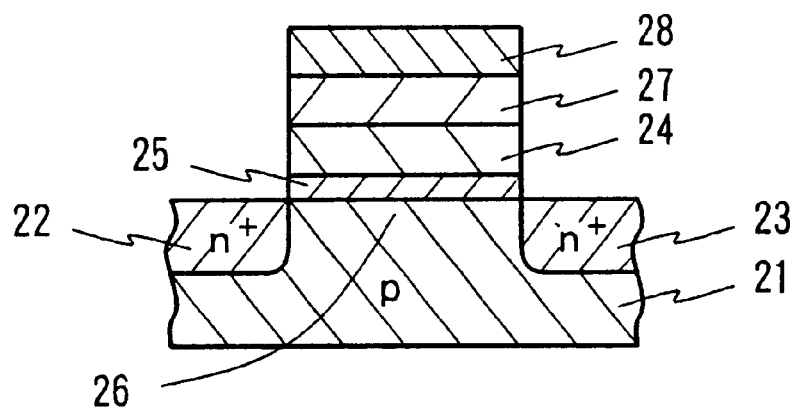
Figure 4:
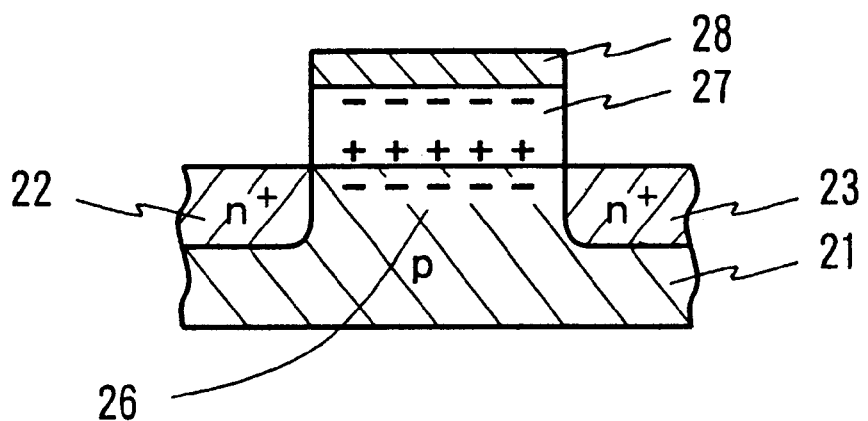
FIGS. 4(a) and 4(b) are operational explanatory views of the semiconductor device using a conventional ferroelectric film.
Figure 4:
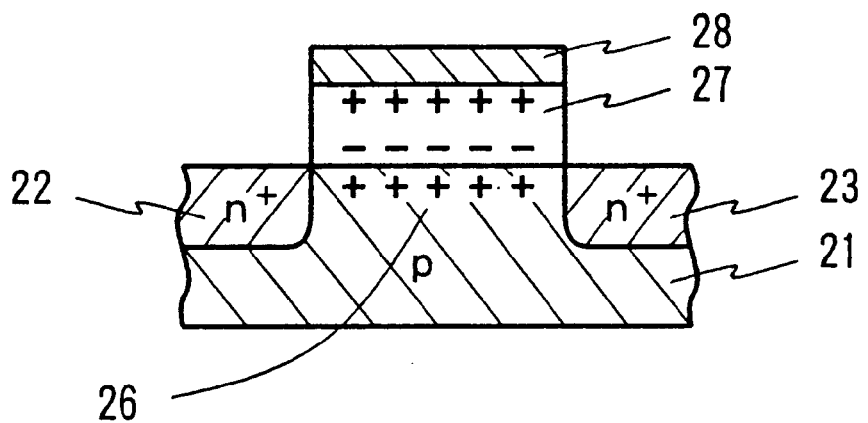

Now, explanations will be made for a semiconductor memory device using a ferroelectric film according to the present invention. FIG. 3 is a view showing a structural example of a semiconductor memory device using a ferroelectric film.

The structure in FIG. 3(a) shows an example of a semiconductor memory device of a MFS structure having a semiconductor substrate 21 formed with a source region 22 and a drain region 23 sandwiching therebetween a channel region 26 on which a ferroelectric film 27 is directly formed to have a gate electrode 28 provided thereon. A ferroelectric film according to the invention is preferably applied to this structure of the semiconductor memory device, because it reduces a native oxide film existing at an interfacial portion between the ferroelectric film and the semiconductor substrate. This makes it possible to effectively apply voltages across the ferroelectric film.

The structure in FIG. 3(b) shows also an example of a semiconductor memory device of an MFIS structure having a semiconductor substrate 21 formed with a channel region 26 on which a ferroelectric film 27 and a gate electrode 28 are formed through a gate dielectric film 25 formed of usual SiO₂. In this structure, the ferroelectric film 27 of the invention has a basic REMNO₃ structure with a specific dielectric coefficient as low as approximately 20. There is no possibility that the gate dielectric film 25 consumes a greater part of the voltage applied to the gate electrode 28. The voltage is sufficiently allocated to the ferroelectric film 27, and accordingly there is no necessity of excessively raising a voltage during writing in.

The structure in FIG. 3(c) shows, similarly to FIG. 3(a), an example of a semiconductor memory device of an MFMIS structure having a semiconductor substrate 21 formed with a channel region 26 on which a floating gate 24 is provided through usual SiO₂, wherein a ferroelectric film 27 and a gate electrode 28 are formed on the floating gate. In this structure, the floating gate 24 can use ZnO doped with a 3-valence element. ZnO is easy to c-axis align on a substrate of a variety of types. Accordingly, it is easy to obtain a ferroelectric film having a basic REMNO₃ structure on the substrate, which has a good crystallinity and hence an excellent ferroelectric characteristic.

To manufacture the above-stated semiconductor memory devices, a usual semiconductor process can be employed, wherein the ferroelectric film can be formed by adopting any of the method stated before. Note that the ferroelectric film may be patterned by an RIE method or the like after forming the film, or by a lift-off technique. The source and drain regions for an FET may be formed by introducing an impurity prior to forming a ferroelectric film, or by self-alignment after forming a ferroelectric film and a gate electrode.

According to a ferroelecric material of the present invention, the basic structure has Re and Mn one of which has a content in excess of the other to a limit in atomic ratio of 0.2 instead of 1, and or the basic structure has a REMNO₃ material added with a 4-valence element. Accordingly, the ferroelectric material reduces the leak current as a defect of REMNO₃, and provides a ferroelectric film with enhanced characteristics with utilizing advantages given by the REMNO₃ in nature. It is therefore possible to provide, at low cost, high-performance electronic components, such as semiconductor memory devices and thin-film capacitors, utilizing a ferroelectric film.

Further, according to a method for making a ferroelectric material and a semiconductor memory device of the present invention, the oxygen partial pressure as a film-forming condition is lower than the film-forming condition for a usual oxide, and a film is formed while blowing oxidation source such as oxygen or ozone only to a film-forming surface of a substrate. Accordingly, the evaporation source or the target is prevented from oxidizing or deviating of composition, thereby enabling stable growth. As a result, a ferroelectric film excellent in crystallinity and high in quality is obtained without encountering an amorphous texture. It is possible for semiconductor memories and thin-film capacitors to provide a ferroelectric film with a basic REMNO₃ structure excellent in ferroelectric characteristics.

Also, according to a semiconductor memory device of the present invention, a ferroelectric film having a basic REMNO₃ structure excellent in crystallinity is employed which is small in dielectric constant. The ferroelectric film is adequately applied with a voltage even through a dielectric film. The ferroelectric film, difficult to pattern, can be formed on a dielectric film. Thus, a high performance semiconductor memory device is obtainable at low cost.

INDUSTRIAL APPLICABILITY

According to the present invention, a ferroelectric film low in dielectric constant and excellent in crystallinity is obtainable. Therefore, the invention is applicable to non-volatile semiconductor memory devices utilizing a ferroelectric film, thin-film capacitors, etc.

What is claimed is:

1. A ferroelectric material having a basic structure of REMnO₃ wherein, said REMnO₃ ferroelectric material is doped with at least one of a 4-valence element and La or part of RE is substituted by at least one of a 4-valence element and La;

wherein RE is at least one member selected from the group consisting of Y, Er, Ho, Tm, Yb and Lu.

2. A ferroelectric material according to claim 1, wherein one of RE and Mn is contained in excess of the other to a limit of 20 at. %.

3. A method of forming the ferroelectric material of claim 1, characterized by:

placing material sources of RE and Mn opposite to a substrate to be formed with a ferroelectric film within a vacuum deposition reactor;

controlling an oxygen partial pressure within said vacuum deposition reactor at $10^{-3}$ Torr or lower;

evaporating metals of said material sources while blowing an oxidizing source to the film forming surface of said substrate;

whereby a ferroelectric material having a basic structure of $REMnO_3$ is film-formed on the surface of said substrate;

wherein the ferroelectric material is film-formed by adding a 4-valence element to said evaporation sources, so that the material having the basic structure of $REMnO_3$ is doped with the 4-valence element or part of RE is substituted by the 4-valence element.

4. A method of forming a ferroelectric material according to claim 3, wherein the oxygen partial pressure is $10^{-6}$ Torr or lower.

5. A method according to claim 3 or 4, wherein the ferroelectric material is film-formed by differing evaporation amounts between RE and Mn so that one of RE and Mn is contained in excess of the other to a limit of 20 at. %.

6. A method of forming the ferroelectric material of claim 1 by placing a target and a substrate oppositely within a reactor to form a ferroelectric film on said substrate by laser abrasion, characterized by:

using a non-oxide target formed of an alloy of RE and Mn as said target material;

controlling an oxygen partial pressure to $10^{-2}$ Torr or lower;

irradiating laser to said target while blowing an oxidizing source to a film-forming surface of said substrate;

whereby a ferroelectric material having a basic structure of $REMnO_3$ is film-formed on the surface of said substrate;

wherein the ferroelectric material is film-formed by adding a 4-valence element to said target, so that the material having the basic structure of $REMnO_3$ is doped with the 4-valence element or part of RE is substituted by the 4-valence element.

7. A method according to claim 6, therein the ferroelectric material is film-formed by differing a content ratio between RE and Mn so that one of RE and Mn is contained in excess of the other to a limit of 20 at. %.

8. A method of forming the ferroelectric film of claim 1 by placing a target and a substrate oppositely within a reactor to form a ferroelectric film on said substrate by sputtering, characterized by:

using a non-oxide target formed of an alloy of RE and Mn as said target;

controlling an oxygen partial pressure to $10^4$ Torr or lower;

applying a voltage to said target while blowing an oxidizing source to a film-forming surface of said substrate;

whereby a ferroelectric material having a basic structure $REMnO_3$ is film-formed on the surface of said substrate;

wherein the ferroelectric material is film-formed by adding a 4-valence element to said target, so that the material having the basic structure of $REMnO_3$ is doped with the 4-valence element or part of RE is substituted by the 4-valence element.

9. A method according to claim 8, wherein the ferroelectric material is film-formed by differing a content ratio between RE and Mn so that one of RE and Mn is contained in excess of the other to a limit of 20 at. %.

10. A semiconductor memory device, having a ferroelectric film on a semiconductor substrate surface side, wherein said ferroelectric film comprises a basic structure of $REMnO_3$ doped with at least one of a 4-valence element and La;

wherein RE is at least one member selected from the group consisting of Y, Er, Ho, Tm, Yb and Lu.

11. A method of manufacturing the semiconductor memory device of claim 10 having a ferroelectric film on the semiconductor substrate surface side, characterized by:

placing material sources of RE and Mn opposite to a substrate to be formed with a ferroelectric film within a vacuum deposition reactor;

controlling an oxygen partial pressure within said vacuum deposition reactor to $10^{-3}$ Torr or lower;

evaporating metals of said material sources while blowing an oxidizing source to the film forming surface of said substrate;

wherein the ferroelectric material is film-formed by adding a 4-valence element to said evaporation sources, so that the material having the basic structure of $REMnO_3$ is doped with the 4-valence element or part of RE is substituted by the 4-valence element.

12. A method of manufacturing the semiconductor memory device of claim 10 having a ferroelectric film on a semiconductor substrate surface side, characterized by:

placing a non-oxide target of an alloy of RE and Mn and a semiconductor substrate oppositely within a reactor;

controlling an oxygen partial pressure within said reactor to $10^{-2}$ Torr or lower;

irradiating laser to said target while blowing an oxidizing source to the film-forming surface of said semiconductor substrate;

whereby a ferroelectric material having a basic structure of $REMnO_3$ is filmed-formed on the surface of said substrate;

wherein the ferroelectric material is film-formed by adding a 4-valence element to said target, so that the material having the basic structure of $REMnO_3$ is doped with the 4-valence element or part of RE is substituted by the 4-valence element.

13. A method of manufacturing the semiconductor memory device in accordance with claim 10 having a ferroelectric film on a semiconductor substrate surface side, characterized by:

placing a non-oxide target of an alloy of RE and Mn and a semiconductor substrate oppositely within a reactor;

controlling any oxygen partial pressure within said reactor to $10^{-4}$ Torr or lower;

applying a voltage to said target to cause sputtering while blowing an oxidizing source to a film-forming surface of said semiconductor substrate;

whereby a ferroelectric material having a basic structure of $REMnO_3$ is film-forming on the surface of said semiconductor substrate;

wherein the ferroelectric material is film-formed by adding a 4-valence element to said target, so that the material having the basic structure of $REMnO_3$ is doped with the 4-valence element or part of RE is substituted by the 4-valence element.

* * * * *